(12) United States Patent
Wakita

(10) Patent No.: US 6,274,422 B1
(45) Date of Patent: Aug. 14, 2001

(54) METHOD FOR MANUFACTURING A SEMICONDUCTOR DEVICE

(75) Inventor: Shinichi Wakita, Kumamoto (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/290,096

(22) Filed: Apr. 12, 1999

(30) Foreign Application Priority Data

Apr. 13, 1998 (JP) .................................................. 10-101508

(51) Int. Cl.[7] .................................................. H01L 21/8234
(52) U.S. Cl. ........................... 438/238; 438/382; 438/210
(58) Field of Search .................................. 438/190, 238, 438/383, 210, 382

(56) References Cited

U.S. PATENT DOCUMENTS

| | | |
|---|---|---|
| 4,228,450 | * 10/1980 | Anantha et al. . |
| 5,319,236 | * 6/1994 | Fujihira ......................... 257/493 |
| 5,679,593 | * 10/1997 | Miller, Jr. et al. . |
| 5,880,001 | * 3/1999 | Camenzind . |
| 6,100,153 | * 8/2000 | Nowak et al. . |
| 6,137,664 | * 10/2000 | Casper et al. ........................... 361/56 |

FOREIGN PATENT DOCUMENTS

| | | | |
|---|---|---|---|
| 56-37645 | 4/1981 | (JP) | ................. H01L/21/88 |
| 57-34356 | 5/1982 | (JP) | ................. H01L/27/06 |
| 60170961 | 9/1985 | (JP) | ................. H01L/27/04 |
| 61-23356 | 1/1986 | (JP) | ................. H01L/27/06 |
| 1-264748 | 11/1986 | (JP) | ................. H01L/27/04 |
| 2-189963 | 7/1990 | (JP) | ................. H01L/27/04 |
| 7131035 | 5/1995 | (JP) | ................. H01L/29/84 |

* cited by examiner

Primary Examiner—Tuan H. Nguyen
(74) Attorney, Agent, or Firm—Hayes, Soloway, Hennessey, Grossman & Hage, PC

(57) ABSTRACT

A first conductive type well layer is formed on a surface of a first conductive type semiconductor substrate. A second conductive type impurity diffusion layer having the conductive type opposite from the first conductive type is formed on a surface of this first conductive type well layer. A second conductive type well layer is formed below the first conductive type well layer. This second conductive type well layer is provided at its both ends with terminals comprising second conductive type well layers passing through the first conductive type semiconductor substrate to reach its surface.

2 Claims, 4 Drawing Sheets

METHOD FOR MANUFACTURING A SEMICONDUCTOR DEVICE

BACKGROUND OF THE INVENTION

1. Field of the Invention

The present invention relates to a semiconductor device and a manufacturing method thereof, and more particularly, to semiconductor device having a resistance element used in a circuit thereof and manufacturing method thereof.

2. Description of the Related Art

Conventionally, when a resistance value required in a resistance element used in a circuit of a semiconductor device is as great as some hundreds kΩ or more, an N-type diffusion layer formed on a surface of a P-type semiconductor substrate or a P-type diffusion layer formed on a surface of an N-type semiconductor substrate is used as the resistance element. These N-type and P-type diffusion layers are manufactured in the same manufacturing step and has the same structure as those of a source or a drain of an MOS transistor formed on the same semiconductor substrate.

There is a method for utilizing an N-well which is a substrate electrode of a P-type MOS transistor as a resistance element having high resistance (which will be referred to as "N-well resistance, hereinafter").

FIGS. 1A to 1D are sectional views showing the conventional manufacturing method of the N-well resistance in the order of manufacturing steps.

First, as shown in FIG. 1A, portions which will become element separation regions on a surface of a P-type semiconductor substrate 32 are selectively oxidized to form LOCOS oxide films 31. Portions in which the LOCOS oxide film 31 is not formed become diffusion layer regions 33.

Next, as shown in FIG. 1B, portions which will become N-well and N-well resistance for a P-type MOS transistor region are selectively subjected to ion implantation of phosphorus with energy of 400 KeV, for example, thereby forming N-well 35 and N-well resistance 34.

Next, as shown in FIG. 1C, portions of the surface of the P-type semiconductor substrate 32 which will become P-well for an N-type MOS transistor region are selectively subjected to ion implantation of boron with energy of 400 KeV, for example, thereby forming P-well 36.

Then, as shown in FIG. 1D, gate polysilicon 37 of the MOS transistor is formed and then, P-type MOS transistor portions are selectively subjected to ion implantation of boron, thereby forming P-type diffusion layers 39 to provide the P-type MOS transistor 41. Next, the N-type MOS transistor portions are selectively subjected to ion implantation of arsenic, thereby forming N-type diffusion layers 40 to provide the N-type MOS transistor 42. Simultaneously, N-well resistance portions are also selectively subjected to ion implantation of arsenic, thereby forming N-type diffusion layers 38 which will become contact portions for wirings of the N-well resistance 34.

However, in recent years, efforts have been made to reduce the resistance value of the diffusion layer portions forming a source or a drain so as to enhance the performance of MOS transistor. As a result, the resistance value of the diffusion layer formed on a surface of a semiconductor substrate is reduced as low as about one-tenth, and the area required to form a resistance element having the same resistance value as that of the conventional element using the diffusion layer is adversely increased as much as ten times.

Further, when the N-well resistance is utilized, dimensional precision when the N-well resistance is formed is extremely inferior to that when the diffusion layer is formed, and if attempt is made to obtain a predetermined resistance value while keeping the precision in some degree, it is necessary to prepare N-well resistance having wide area, which can be a cause to adversely influence the integrated degree of a semiconductor integrated circuit.

FIG. 2 is a plan view of one example of layout when a resistance of 100 kΩ is formed using a conventional N-well resistance. Here, the resistance value of N-well resistance 51 is 700 kΩ, width of the N-well resistance is 5 micron, a distance between adjacent N-well resistances is 3 micron. Since the N-well resistance 51 is formed simultaneously with manufacturing steps of the P-type MOS transistor and the N-type MOS transistor as described above, the N-well resistance 51 can not be formed in a region where the MOS transistor is formed in a superposing manner. Therefore, a region for the N-well resistance is set separately from the MOS transistor region, and ten N-well resistance 51 each having the length of 71.5 micron and the width of 5 micron are connected to one another in series by aluminum wirings 52, thereby realizing the resistance of 100 kΩ. The region required for the layout of this N-well resistance is as large as about 71.5 micron in the lateral direction and 79 micron in the vertical direction.

As described above, it is necessary to set a region for forming the conventional N-well resistance separately from the MOS transistor region, which adversely influences the integrated degree of a semiconductor integrated circuit.

SUMMARY OF THE INVENTION

It is an object of the present invention to provide a semiconductor device and a manufacturing method thereof using a resistance element which does not adversely influence the integrated degree of a semiconductor integrated circuit.

A semiconductor device according to the present invention, comprises: a first conductive type well layer formed on a surface of the semiconductor substrate; a second conductive type impurity diffusion layer having source/drain of MOS transistor formed on a surface of the first conductive type well layer and is the opposite conductive type; a second conductive type well layer formed below the first conductive type well layer; and terminals consist of second conductive type well layers formed on opposite ends of the second conductive type well layer such as to respectively reach the surface of the semiconductor substrate.

A manufacturing method of a semiconductor device according to the invention, comprises the steps of: forming a element separating oxidation film on a surface of a first conductive type semiconductor substrate; forming a second conductive type well layer having the conductive type opposite from the first conductive type in the deep portion, in the first conductive type semiconductor substrate by ion implantation; forming terminals on opposite ends of the second conductive type well layer such as to respectively break through the surface of the first conductive type semiconductor substrate; forming a first conductive type well layer on the surface of the first conductive type semiconductor substrate above the second conductive type well layer; and forming a second conductive type impurity diffusion layer on a surface of the first conductive type well layer.

With the above structure, a resistance element can be formed in superposed manner below an MOS transistor formed on the surface of the first conductive type semiconductor substrate. Therefore, it is possible to enhance the integrated degree of a semiconductor integrated circuit.

It is preferable that the second conductive type resistance well layer is formed by subjecting a first conductive type semiconductor substrate to ion implantation with 800 keV using phosphorus as impurity.

In the semiconductor device of the invention, the second conductive type resistance well layer is formed in the deep portion in the first conductive type semiconductor substrate, and the first conductive type MOS transistor is formed above the second conductive type resistance well layer. Therefore, it is unnecessary to set a formation region for the MOS transistor region separately from the N-well resistance unlike the conventional resistance using the well layer, and it is possible to enhance the integrated degree of a semiconductor integrated circuit.

DESCRIPTION OF THE PREFERRED EMBODIMENT

A preferred embodiment of the present invention will be explained below with reference to the accompanying drawings.

Figure 1A:
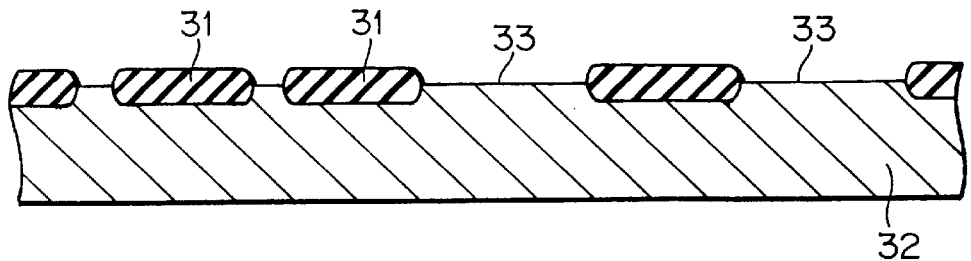
FIGS. 1A to 1D are sectional views showing a conventional manufacturing method of the N-well resistance in the order of manufacturing steps.
Figure 1B:
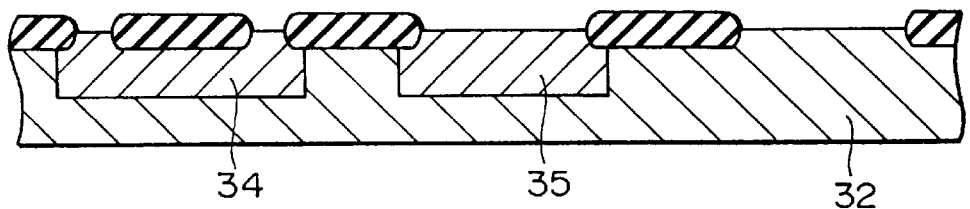
Figure 1C:
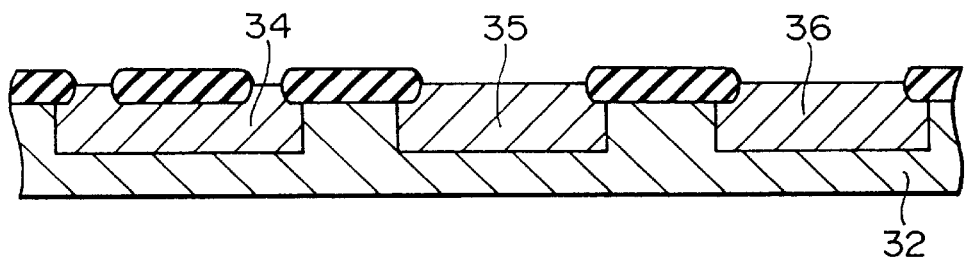
Figure 1D:
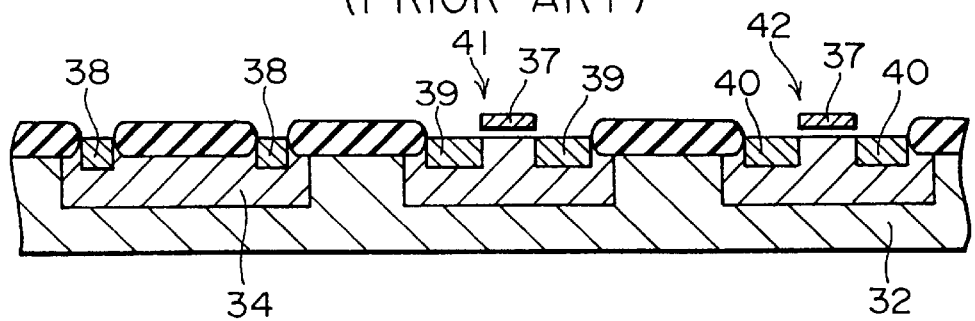
Figure 2:
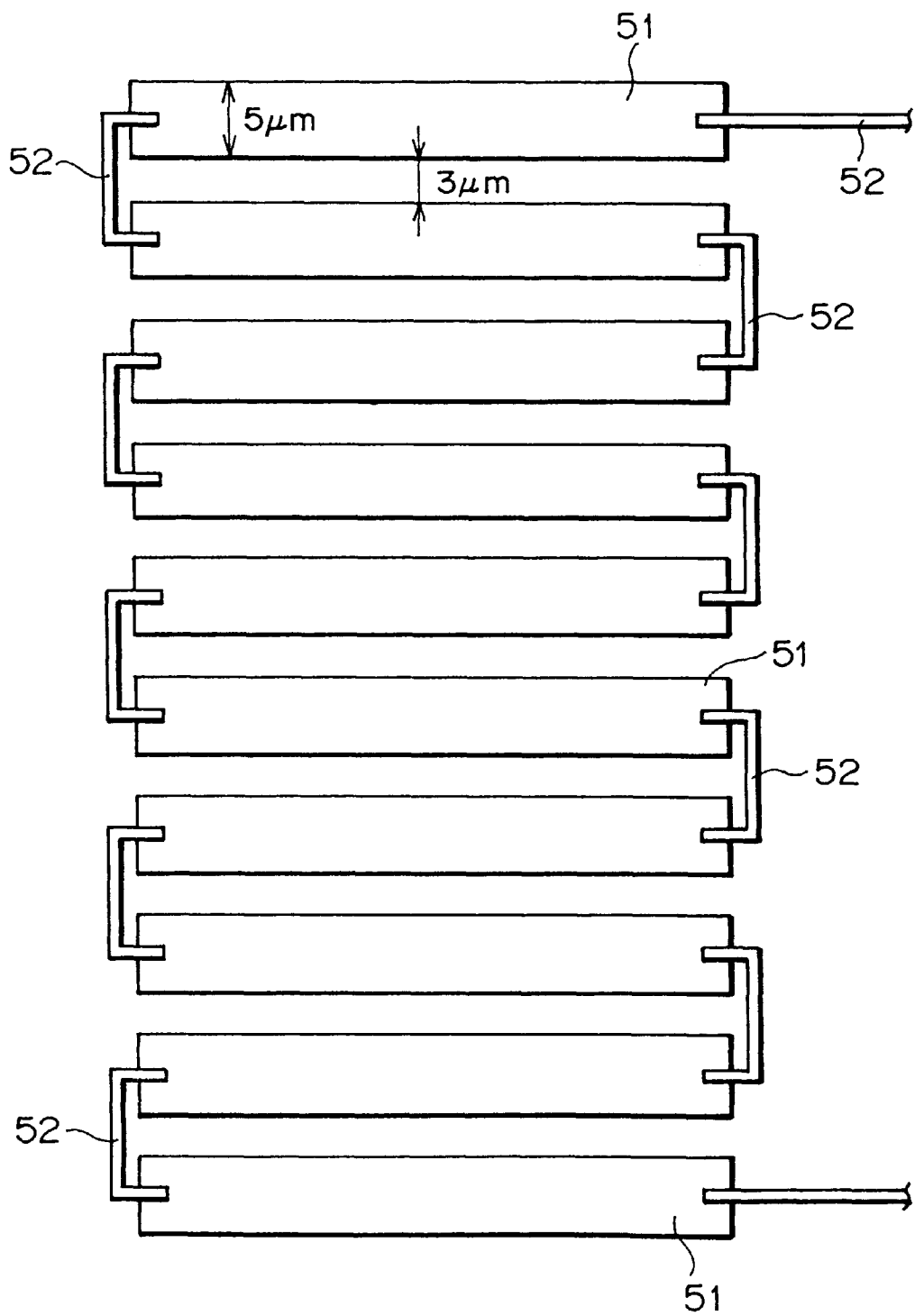
FIG. 2 is a plan view of one example of layout when a resistance of 100 kΩ is formed using a conventional N-well resistance.
Figure 3:
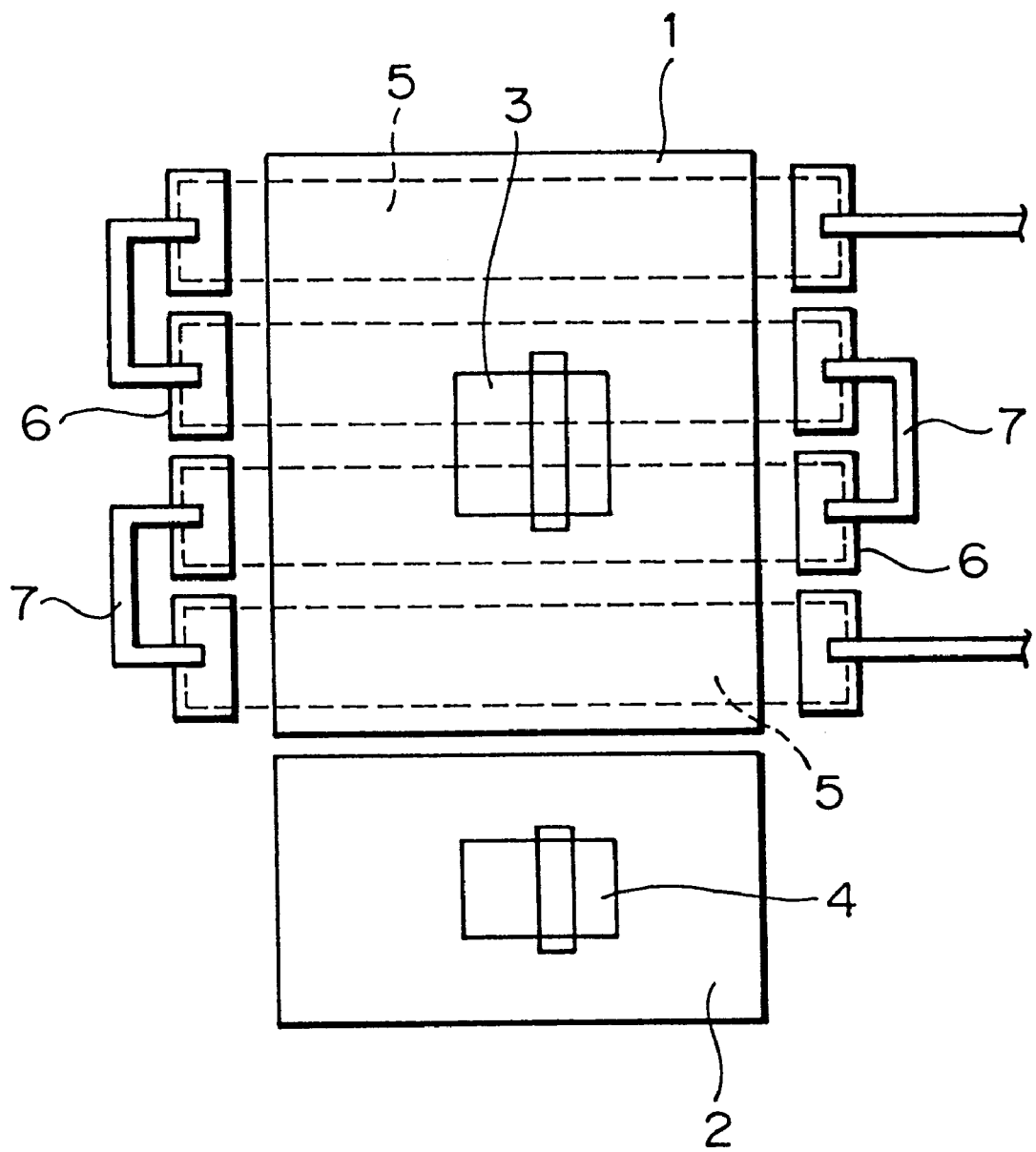
FIG. 3 is a plan view showing a semiconductor device according to an embodiment of the present invention.

FIG. 3 is a plan view showing a semiconductor device according to the embodiment of the invention. A P-well 1 and an N-well 2 are formed adjacent each other on a surface of a semiconductor substrate. An N-type MOS transistor 3 is formed at the center of the P-well 1, and a P-type MOS transistor 4 is formed at the center of the N-well 2. N-well resistors 5 are provided in the semiconductor substrate and below the P-well 1. N-wells 6 reaching the surface of the semiconductor substrate are formed at the both ends of each of the N-well resistances 5. The N-wells 6 are connected to one another through metal wirings 7 such that the N-well resistances 5 are connected in series.

FIGS. 4A to 4E are sectional views showing a manufacturing method of the semiconductor device according to the embodiment of the invention in the order of steps.

Figure 4A:
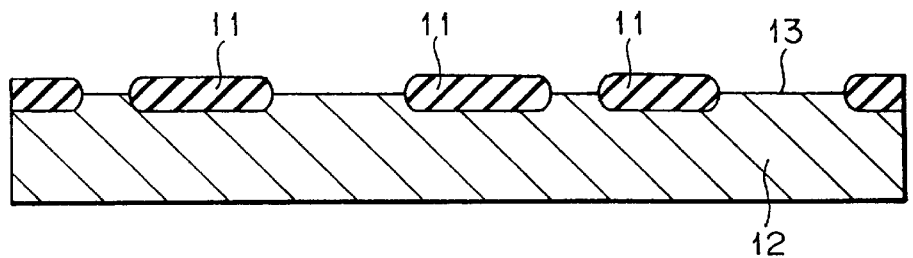
FIGS. 4A to 4E are sectional views showing a manufacturing method of the semiconductor device according to the embodiment of the invention.

First, as shown in FIG. 4A, portions which will become element separation regions on a surface of a P-type semiconductor substrate 12 are selectively oxidized to form LOCOS oxide films 11. Portions in which the LOCOS oxide film 11 is not formed become diffusion layer regions 13.

Figure 4B:
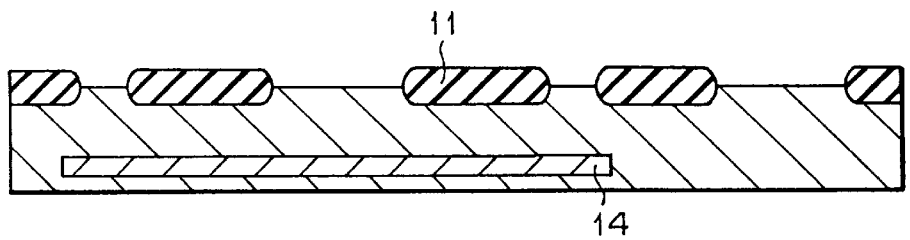

Next, as shown in FIG. 4B, a portion of the surface of the P-type semiconductor substrate 12 covering three of the diffusion layer regions 13 blocked on LOCOS oxide film 11 is subjected to ion implantation of phosphorus with high energy of 800 KeV, for example, thereby forming an N-type resistance well layer 14 in the deep portion in the P-type semiconductor substrate 12 covering the three diffusion regions.

Figure 4C:
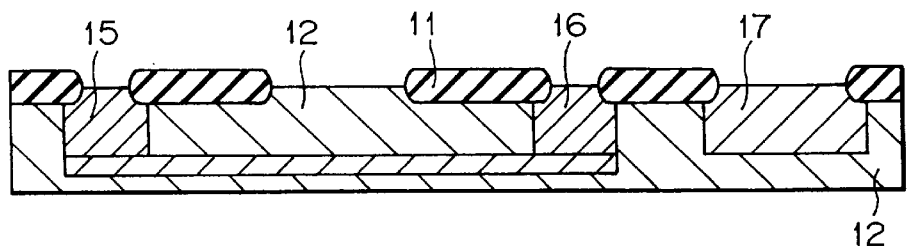

Next, as shown in FIG. 4C, portions which will become N-wells are selectively subjected to ion implantation of phosphorus with energy of 400 keV, for example, thereby forming N-wells 15, 16 and 17 which are located shallower than the N-type resistance well layer 14. An upper surface of the high-energy implanted N-well resistance 14 and lower surfaces of the N-wells 15 and 16 are electrically conducted, and the N-wells 15 and 16 function as terminals which connect the N-type resistance well layer 14 to the metal wirings.

Figure 4D:
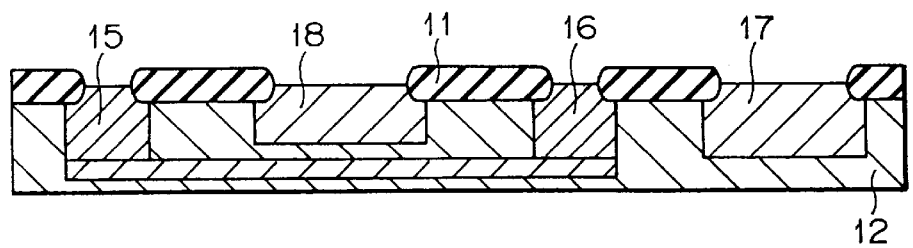

Next, as shown in FIG. 4D, middle one of the three diffusion layer regions 13 is selectively subjected to ion implantation of boron with energy of 400 KeV, for example, thereby forming a P-well 18 above the high-energy implanted N-well resistance 14.

Figure 4E:
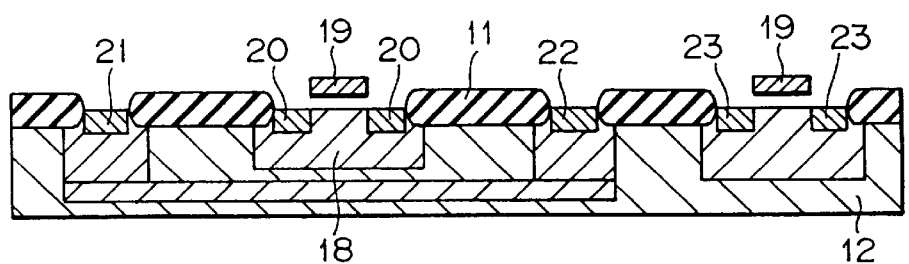

Then, as shown in FIG. 4E, a polysilicon 19 and N-type diffusion layers 20, 20 are formed in the P-well 18, and an N-type MOS transistor is formed. N-type diffusion layers 21, 22 are also formed simultaneously with formation steps of the N-type diffusion layers 20, 20, and the N-type diffusion layers 21, 22 are utilized for contacting the high-energy implanted N-well resistance 14 with the metal wirings.

Further, another gate polysilicon 19 and P-type diffusion layers 23, 23 are formed in the N-well 17, and the P-type MOS transistor is formed.

As described above, according to the semiconductor device of the embodiment, the high-energy implanted N-well resistance 14 is provided below the semiconductor substrate, and the N-type MOS transistor comprising the P-well 18, the gate polysilicon 19 and the N-type diffusion layers 20, 20 can be disposed above the N-well resistance 14. Therefore, it is unnecessary to set a formation region for N-well resistance separately from the MOS transistor region unlike the conventional N-well resistance, and it is possible to enhance the integrated degree of a semiconductor integrated circuit.

It should be understood that the technical scope of the present invention should not be limited to the above-described embodiment, and the present invention can be variously changed without departing from its subject.

What is claimed is:

1. A manufacturing method of a semiconductor device, comprising the steps of:

forming an element separating oxidation film on a surface of a first conductive type semiconductor substrate;

forming a discrete second conductive type resistance well layer having the conductive type opposite from said first conductive type, in said first conductive type semiconductor substrate below the surface thereof by ion implantation;

forming second conductive type well layers on opposite ends of said discrete resistance well layer such as to respectively reach the surface of said semiconductor substrate;

forming a first conductive type well layer on the surface of said semiconductor substrate above said resistance well layer; and forming a second conductive type source/drain diffusion layer on a surface of said first conductive type well layer.

2. A manufacturing method of a semiconductor device according to claim 1, wherein said discrete second conductive type resistance well layer is formed by subjecting a first conductive type semiconductor substrate to ion implantation using phosphorus as impurity.

* * * * *